(12) United States Patent
Liu et al.

(10) Patent No.: US 9,866,187 B2
(45) Date of Patent: Jan. 9, 2018

(54) HIGH EFFICIENCY CLASS D AMPLIFIER WITH REDUCED GENERATION OF EMI

(71) Applicant: STMicroelectronics (Shenzhen) R&D Co. Ltd, Shenzhen (CN)

(72) Inventors: Qi Yu Liu, Shenzhen (CN); Hong Wu Lin, Shenzhen (CN)

(73) Assignee: STMicroelectronics (Shenzhen) R&D Co. Ltd, Shenzhen (CN)

( * ) Notice: Subject to any disclaimer, the term of this patent is extended or adjusted under 35 U.S.C. 154(b) by 0 days.

(21) Appl. No.: 14/715,879

(22) Filed: May 19, 2015

(65) Prior Publication Data
US 2016/0329868 A1 Nov. 10, 2016

(30) Foreign Application Priority Data
May 8, 2015 (CN) .......................... 2015 1 0234028

(51) Int. Cl.
*H03F 3/38* (2006.01)
*H03F 3/183* (2006.01)
(Continued)

(52) U.S. Cl.
CPC ........... *H03F 3/183* (2013.01); *H03F 3/2173* (2013.01); *H03F 3/45475* (2013.01);
(Continued)

(58) Field of Classification Search
CPC ...... H03F 3/38; H03F 2200/351; H03F 3/217; H03F 3/183; H03F 3/2175; H03F 3/45076
(Continued)

(56) References Cited

U.S. PATENT DOCUMENTS 6,614,297 B2 * 9/2003 Score .................. H03F 3/217
330/10
7,332,962 B2 * 2/2008 Wu ...................... H03F 3/2173
330/10
(Continued)

FOREIGN PATENT DOCUMENTS

EP 1594223 A1 11/2005

OTHER PUBLICATIONS

EP Search Report and Written Opinion for counterpart EP 15197508.3 dated Sep. 27, 2016 (9 pages).

*Primary Examiner* — Khanh V Nguyen
(74) *Attorney, Agent, or Firm* — Gardere Wynne Sewell LLP (57) ABSTRACT

A class-D amplifier includes a signal processing block. The signal processing block generates a first processed signal representing a difference between a first differential signal and a second differential signal, when a duty cycle of the first differential signal is greater than that of the second differential signal. The signal processing block generates the first processed signal representing a reference DC level, when the duty cycle of the first differential signal is less than that of the second differential signal. A second processed signal representing a difference between the second differential signal and the first differential signal is generated when the duty cycle of the second differential signal is greater than that of the first differential signal, and the second processed signal representing the reference DC level is generated when the duty cycle of the second differential signal is less than that of the first differential signal.

21 Claims, 5 Drawing Sheets

(51) Int. Cl.
*H03F 3/45* (2006.01)
*H03F 3/217* (2006.01)

(52) U.S. Cl.
CPC ............ *H03F 3/217* (2013.01); *H03F 3/2171* (2013.01); *H03F 2200/03* (2013.01); *H03F 2203/45138* (2013.01)

(58) Field of Classification Search
USPC ........................................ 330/10, 207 A, 251
See application file for complete search history.

(56) References Cited

U.S. PATENT DOCUMENTS

| | | | | |
|---|---|---|---|---|
| 7,355,473 | B2* | 4/2008 | Wu | H03F 3/2173 330/10 |
| 7,385,444 | B2* | 6/2008 | Kurokawa | H03F 3/2171 330/10 |
| 7,786,796 | B2* | 8/2010 | Liu | H03F 3/187 330/10 |
| 7,816,982 | B2* | 10/2010 | Wu | H03F 3/2173 330/10 |
| 7,852,155 | B2* | 12/2010 | Chaoui | H03F 1/52 330/251 |
| 7,855,597 | B2* | 12/2010 | Chen | H03F 3/2173 330/10 |
| 2003/0006837 | A1* | 1/2003 | Score | H03F 3/217 330/10 |
| 2004/0232979 | A1 | 11/2004 | Edwards et al. | |
| 2006/0044057 | A1* | 3/2006 | Hezar | H03F 1/34 330/10 |

* cited by examiner

HIGH EFFICIENCY CLASS D AMPLIFIER WITH REDUCED GENERATION OF EMI

PRIORITY CLAIM

This application claims priority from Chinese Application for Patent No. 201510234028.6 filed May 8, 2015, the disclosure of which is incorporated by reference.

TECHNICAL FIELD

This disclosure is related to the field of class D audio amplifiers, and, more particularly, to a class D amplifier design with reduced EMI as compared to conventional class D amplifiers.

BACKGROUND

Portable electronic devices, such as smartphones and tablets are popular with consumers. Such portable electronic devices are capable of audio playback, and thus employ audio amplifiers. Since these portable electronic devices are powered by batteries, reduction of power consumption is a commercial desire, and thus class D audio amplifiers, which are more efficient than class AB audio amplifiers, may potentially be useful for incorporation into these electronic devices.

A class D amplifier is an electronic amplifier in which the amplifying devices (typically MOSFETs) operate as electronic switches, instead of as linear gain devices as in other amplifiers. The analog signal to be amplified is converted to a series of square pulses before being applied to the amplifying devices. Since the signal to be amplified is a train of constant amplitude pulses, the amplifying devices switch rapidly back and forth between conductive and nonconductive states. After amplification, the output pulse train can be converted back to an analog signal by passing it through a passive low pass filter.

As stated, an advantage of a class D amplifier is that it can be more efficient than other amplifiers, since less power is dissipated as heat in the active devices. However, the switching of the active devices results in increased EMI, which is particularly undesirable in smartphones and tablets. As such, improved class D amplifier designs which reduce EMI are commercially desirable.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

An electronic device in accordance with this disclosure includes first and second comparators configured to respectively convert first and second analog audio input signals into first and second audio square waves. A logic block is coupled to receive the first and second audio square waves from the first and second comparators. The logic block is configured to generate a first processed audio signal representing a difference between the first audio square wave and the second audio square wave when a duty cycle of the first audio square wave is greater than a duty cycle of the second audio square wave, generate the first processed audio signal having a reference DC level when the duty cycle of the first audio square wave is less than the duty cycle of the second audio square wave, generate a second processed audio signal representing a difference between the second audio square wave and the first audio square wave when the duty cycle of the second audio square wave is greater than the duty cycle of the first audio square wave, and generate the second processed audio signal having the reference DC level when the duty cycle of the second audio square wave is less than the duty cycle of the first audio square wave. First and second output stages are coupled to the logic block and configured to generate first and second audio output signals respectively based upon the first and second processed audio signals.

Another embodiment is directed to a class D amplifier that includes a signal processing block configured to generate a first processed signal representing a difference between a first differential signal and a second differential signal when a duty cycle of the first differential signal is greater than a duty cycle of the second differential signal, generate the first processed signal representing a reference DC level when the duty cycle of the first differential signal is less than the duty cycle of the second differential signal, generate a second processed signal representing a difference between the second differential signal and the first differential signal when the duty cycle of the second differential signal is greater than the duty cycle of the first differential signal, and generate the second processed signal representing the reference DC level when the duty cycle of the second differential signal is less than the duty cycle of the first differential signal.

A method aspect is directed to a method of amplifying an analog audio signal. The method includes receiving a first analog signal, the first analog signal being the analog signal. The method also includes receiving a second analog signal, the second analog signal being a complement of the analog signal. The first and second analog input signals are converted into first and second square waves. A first processed signal representing a difference between the first square wave and the second square wave is generated when a duty cycle of the first square wave is greater than a duty cycle of the second square wave. The first processed signal is generated as a reference DC level when the duty cycle of the first square wave is less than the duty cycle of the second square wave. A second processed signal representing a difference between the second square wave and the first square wave is generated when the duty cycle of the second square wave is greater than the duty cycle of the first square wave. The second processed signal is generated as the reference DC level when the duty cycle of the second square wave is less than the duty cycle of the first square wave, and first and second output signals are respectively generated based upon the first and second processed signals, using respective first and second output stages.

DETAILED DESCRIPTION

One or more embodiments will be described below. These described embodiments are only examples of implementation techniques, as defined solely by the attached claims. Additionally, in an effort to provide a focused description, irrelevant features of an actual implementation may not be described in the specification.

Figure 1:
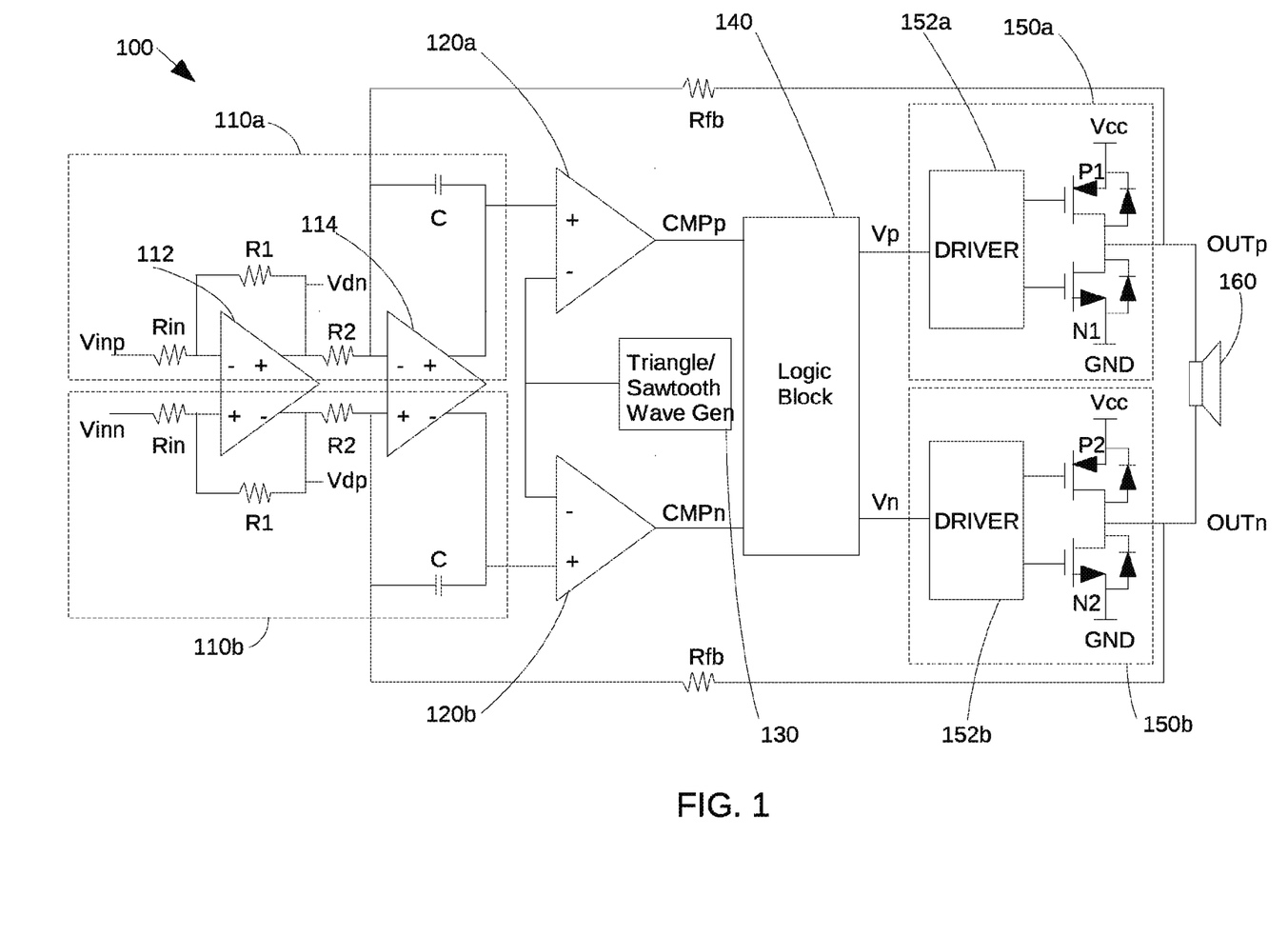
FIG. 1 is a schematic diagram of a class D amplifier in accordance with this disclosure.

With reference to FIG. 1, a class D amplifier 100 having a bridge tied load 160 is now described. First, the structure of the class D amplifier 100 will be described, and then operation thereof will be described.

The class D amplifier 100 includes a first analog audio input channel 110a and a second analog audio input channel 110b. The first and second analog audio input channels 110a, 110b both include the same fully differential amplifier 112. The fully differential amplifier 112 includes input resistors Rin and feedback resistors R1, which set the gain. The outputs of the fully differential amplifier 112 feed into another fully differential amplifier 114, which has input resistors R2 and feedback capacitors C. The non-inverting output of the fully differential amplifier 114 is fed to the non-inverting input of a comparator 120a, while the inverting output of the fully differential amplifier 114 is fed to the non-inverting input of a comparator 120b. A signal generator 130 is coupled to the inverting inputs of both the comparator 120a and a comparator 120b.

The outputs of the comparator 120a and the comparator 120b are fed to a logic block 140, which has outputs fed to the output stage 150a and the output stage 150b. The output stage 150a includes a driver 152a having an input coupled to an output of the logic block 140. The output stage 150a also includes a first PMOS transistor P1 and a first NMOS transistor N1. The first PMOS transistor P1 has its source coupled to a power supply Vcc, and its gate coupled to a first output of the driver 152a. A diode D1 is coupled between the source and drain of the first PMOS transistor P1. The first NMOS transistor N1 has its source coupled to the drain of the first PMOS transistor P1, its drain coupled to ground GND, and its gate coupled to a second output of the driver 152a. A diode D2 is coupled between the source and drain of the first NMOS transistor N1.

The output stage 150b includes a driver 152b having an input coupled to an output of the logic block 140. The output stage 150b also includes a second PMOS transistor P2 and a second NMOS transistor N2. The second PMOS transistor P2 has its source coupled to the power supply Vcc, and its gate coupled to a first output of the driver 152b. A diode D3 is coupled between the source and drain of the second PMOS transistor P2. The second NMOS transistor N2 has its source coupled to the drain of the second PMOS transistor P2, its drain coupled to ground GND, and its gate coupled to a second output of the driver 152b. A diode D4 is coupled between the source and drain of the second NMOS transistor N2.

A load 160 has a first input coupled to the drain of the first PMOS transistor P1 and source of the first NMOS transistor N1, and has a second input coupled to the drain of the second PMOS transistor P2 and source of the second NMOS transistor N2. Resistors Rfb are coupled between the load 160 and inputs of the fully differential amplifier 114. The load 160 may, for example, comprise an analog speaker.

Figure 3:
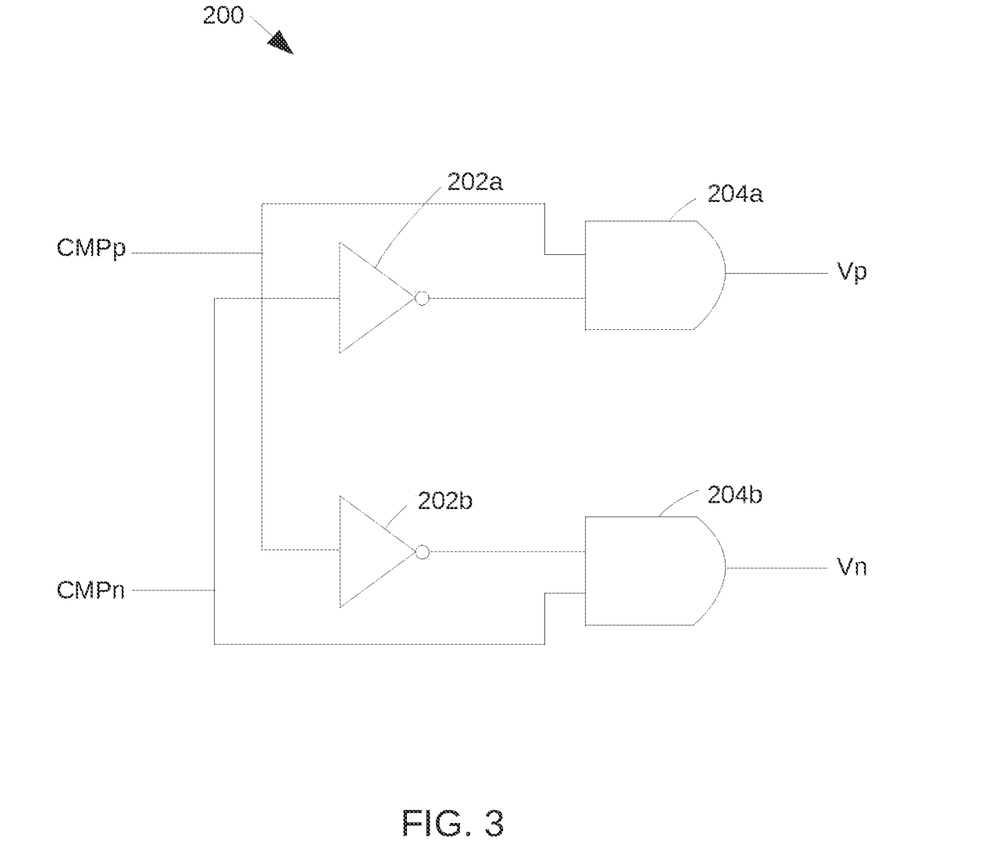
FIG. 3 is a schematic diagram of an embodiment of the logic block of the class D amplifier of FIG. 1 where the signal generator is a sawtooth wave generator.

With reference to FIG. 3, structure of the logic block 140 will now be described. The logic block 140 includes a first inverter 202a, which has an input coupled to the output CMPp of the comparator 120b and an output coupled to a first input of the AND gate 204a. The AND gate 204a has a second input coupled to the output of the comparator 120a, and an output Vp coupled to the first output stage 150a.

The logic block 140 also includes a second inverter 202b, which has an input coupled to the output CMPn of the comparator 120a and an output coupled to a first input of the AND gate 204b. The AND gate 204b has a second input coupled to the output of the comparator 120b, and an output Vn coupled to the second output stage 150b.

Operation of the class D amplifier 100 will now be described with reference to FIGS. 1-3. The inputs of the fully differential amplifier 112 respectively receive first and second analog audio input signals. The fully differential amplifier 112 rejects common mode noise in the first and second analog audio input signals, and outputs the first and second analog audio input signals as first and second differential signals, with the common mode noise removed, to the fully differential amplifier 114, which serves to remove an unwanted DC offset from the first and second analog audio input signals. In some applications, the first and second analog audio input signals may be separate single input signals and not differential signals, as will be appreciated by those of skill in the art.

The first analog audio output signal Vdn is then fed from the fully differential amplifier 114 to the comparator 120a, which compares the first analog audio input signal to a sawtooth wave generated by the signal source or wave generator 130. This results in the generation of a first audio square wave CMPp having a duty cycle proportional to the amplitude of the first analog audio input signal. The first analog audio input signal and wave generated by the wave generator 130 are shown in FIG. 2 next to the label SAWTOOTH, while the first audio square wave is shown next to the label CMPP.

Similarly, the second audio output signal Vdp is fed from the fully differential amplifier 114 to the comparator 120b, which also compared the second analog audio input signal to the triangle or sawtooth wave generated by the wave generator 130. This also results in the generation of a second audio square wave CMPn having a duty cycle proportional to the amplitude of the second analog audio input signal. The second audio square wave is shown next to the label CMPN in FIG. 2.

The logic block 140 receives the first audio square wave and generates a first processed audio signal Vp therefrom. The logic block 140 generates the first processed audio signal Vp by its AND gate 204a performing a logic AND operation on the first audio square wave and an inverse of the second audio square wave. When the duty cycle of the first audio square wave is greater than the duty cycle (reference 300) of the second audio square wave, the first processed audio signal thus represents a difference between the first audio square wave and second audio square wave. When the duty cycle of the first audio square wave is less than the duty cycle of the second audio square wave (reference 302), the first processed audio signal thus represents a reference DC level or common mode voltage.

The logic block 140 also generates a second processed audio signal Vn from the second audio square wave. The logic block 140 generates the second processed audio signal Vn by its AND gate 204b performing a logic AND operation on the second audio square wave and an inverse of the first audio square wave. When the duty cycle of the second audio square wave is greater than the duty cycle of the first audio square wave (reference 302), the second processed audio signal thus represents a difference between the second audio square wave and the first audio square wave. When the duty cycle of the second audio square wave is less than the duty cycle of the first audio square wave (reference 300), the second processed audio signal Vn thus represents the reference DC level or the common mode voltage.

As shown by viewing the first and second processed audio signals Vp, Vn, the first and second processed audio signals are not high at the same time, and merely one of the audio signals is high during a single period of the triangle or sawtooth wave, and that audio signal is high but once during that single period. Thus, either P1 and N1 switch during a single period, or P2 and N2 switch during that single period, but not both pairs of transistors.

With conventional class D amplifiers, the first and second processed audio signals may be high at the same time. Thus, in conventional class D amplifiers, the transistors P1, N1 and P2, N2 will all switch twice during a single period of the triangle or sawtooth wave. The class D amplifier 100 disclosed herein thus reduces the amount of switching by 50% over conventional designs, resulting in greatly reduced EMI.

The driver 152a receives the first processed audio signal and amplifies it. When the first processed audio signal Vp is at a logic high, the first NMOS transistor N1 turns off, and the first PMOS transistor P1 turns on and generates the first audio output signal OUTp as high. When the first processed audio signal Vp is at a logic low, first PMOS transistor P1 turns off, and the first NMOS transistor N1 turns on and pulls the first audio output signal OUTp low.

The driver 152b likewise receives the second processed audio signal and drives the power MOS devices P2, N2. When the second processed audio signal Vn is at a logic high, the second NMOS transistor N2 turns off, and the second PMOS transistor P1 turns on and generates the second audio output signal OUTn as high. When the second processed audio signal Vn is at a logic low, the second PMOS transistor P2 turns off, and the second NMOS transistor N2 turns on and pulls the second audio output signal low OUTn.

Figure 2:
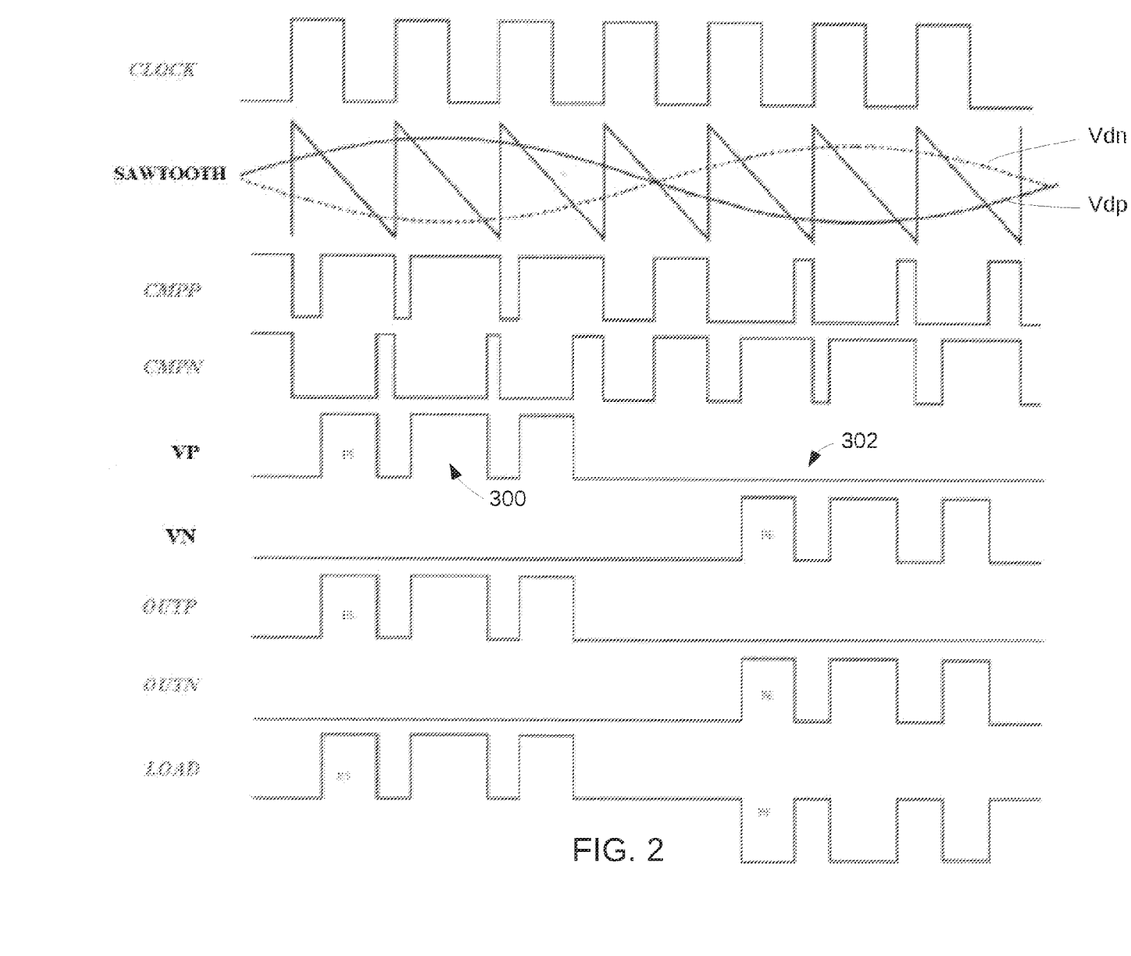
FIG. 2 is a timing diagram of the class D amplifier of FIG. 1 in operation where the signal generator is a sawtooth wave generator.

The first audio output signal OUTp pulls the signal at the load, labeled LOAD in FIG. 2, high. On the other hand, the second audio output signal OUTn pulls the signal at the load, labeled LOAD in FIG. 2, negative. The signal at the load represents a difference between the first and second audio output signals OUTp, OUTn. Thus, if the first and second audio output signals OUTp, OUTn are high at the same time as is possible with conventional class D amplifiers and lack an overlapping transition, the signal at the load will transition four times for a given time period. However, as shown in FIG. 2, as a result of the operations performed by the logic block 140, the first and second audio output signals OUTp, OUTn would not be high at a same time. Thus, the signal at the load will transition but two times for the same given time period, as opposed to four times as in conventional systems. This halving of the number of transitions of the signal at the load.

It should be appreciated that the wave generator 130 may generate a triangle wave instead of a sawtooth wave. This may result in CMPp and CMPn, output by comparators 120a and 120b, having no simultaneous transitions. In this case, the logic block 140 generates Vp and Vn as will now be described with reference to the flowchart 300 of FIGS. 4-5.

Due to the differential amplifier 112, Vdp and Vdn are fully differential output signals, and the frequency of the triangle wave is higher than the frequency of the analog audio input signal. Therefore, the width of P1 is equal to the width of P2, and the width of P3 is equal to the width of P4 in FIG. 5.

Figure 4:
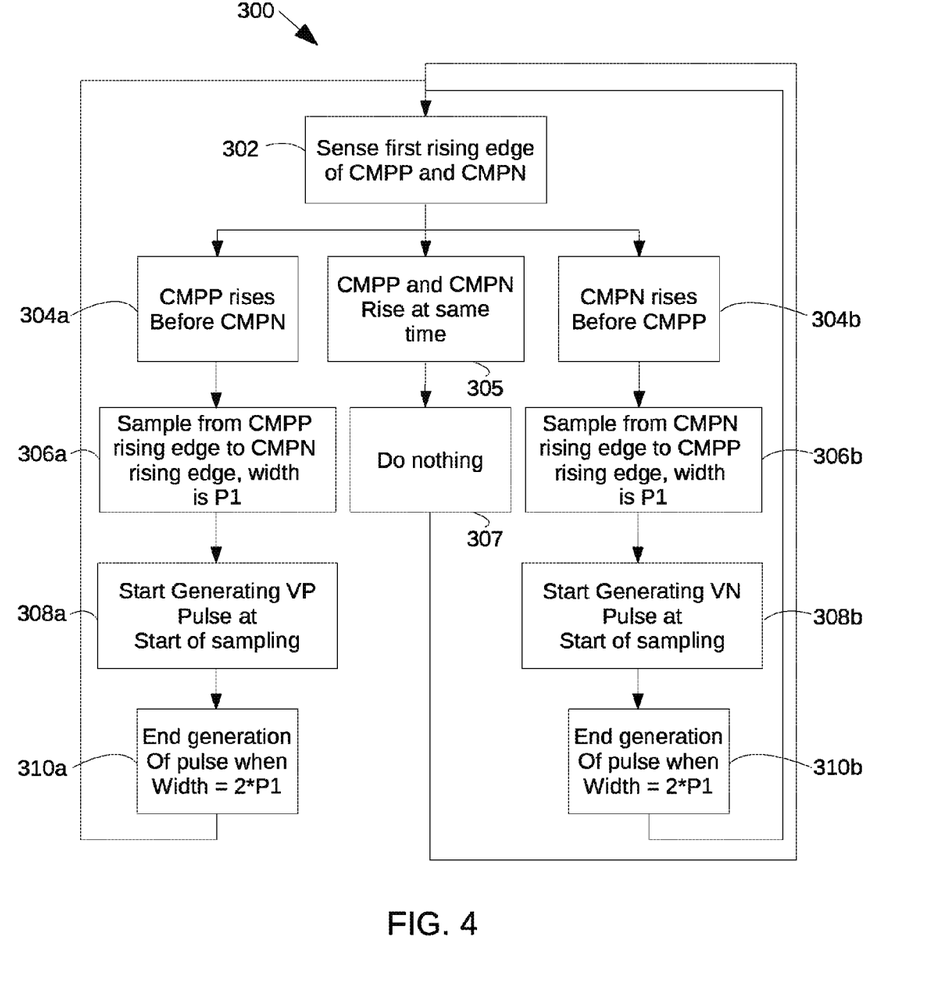
FIG. 4 is a flowchart of operation of the class D amplifier of FIG. 1 where the signal generator is a triangle wave generator.
Figure 5:
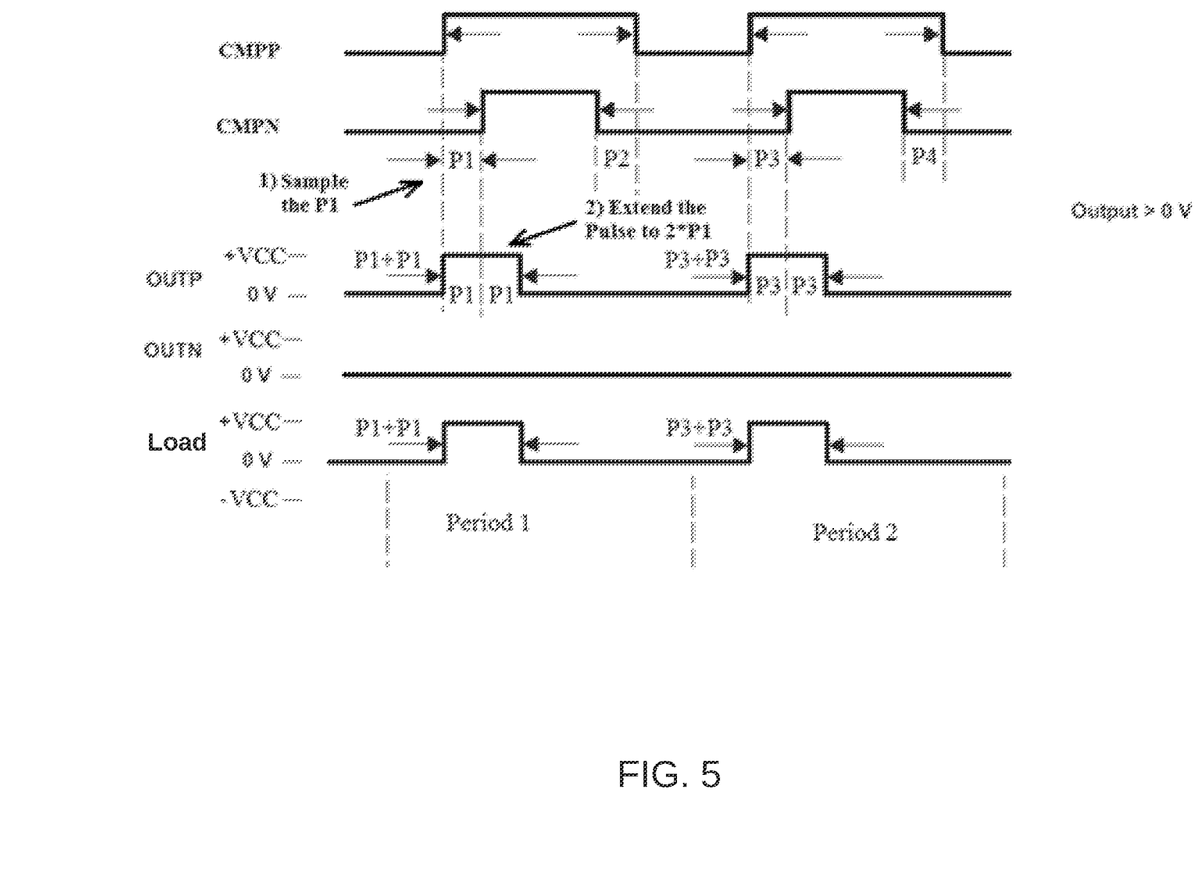
FIG. 5 is a timing diagram of the class D amplifier of FIG. 1 in operation where the signal generator is a triangle waver generator.

The logic block 140 monitors both CMPp and CMPn to sense a first rising edge (Block 302). If CMPp has a rising edge before CMPn (Block 304a), then the logic block 140 samples from the rising edge of CMPp to the rising edge of CMPn (Block 306a). This is shown in the timing diagram of FIG. 5, and this period of time is referred to as P1. The logic block 140 starts outputting Vp as high at the start of the sampling (Block 308a), and transitions Vp to low at an elapsed time of 2*P1 (Block 310a), as also shown in FIG. 5. The logic block 140 then returns to monitoring both CMPp and CMPn (Block 302). The load ultimately receives the output signal as 2*P1=P1+P2=CMPP−CMPN.

If CMPn had the first rising edge before CMPp (Block 304b), then the logic block 140 samples from the rising edge of CMPn to the rising edge of CMPp (Block 306b). The logic block 140 starts outputting Vn as high at the start of the sampling (Block 308b), and thereafter transitions Vn to low at an elapsed time equal to double the length of time from the rising edge of CMPn to the rising edge of CMPp (Block 310b). The logic block 140 then returns to monitoring both CMPp and CMPn (Block 302).

In the case where CMPp and CMPn rise at the same time (Block 305), the logic block 140 takes no action, leaving Vp and Vn as low (Block 307), and continues to monitor both CMPp and CMPn (Block 302).

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An electronic device, comprising:
   first and second comparators configured to respectively convert first and second analog audio input signals into first and second audio square waves by comparing the first and second analog audio input signals to a triangle waves;
   a logic block coupled to receive the first and second audio square waves from the first and second comparators and configured to:
   generate a first processed audio signal representing a difference between the first audio square wave and the second audio square wave when a duty cycle of the first audio square wave is greater than a duty cycle of the second audio square wave, and being generated to have a pulse representing more than a period of time from a rising edge of the first audio square wave to a rising edge of the second audio square wave,
   generate the first processed audio signal having a reference DC level when the duty cycle of the first audio square wave is less than the duty cycle of the second audio square wave,
   generate a second processed audio signal representing a difference between the second audio square wave and the first audio square wave when the duty cycle of the second audio square wave is greater than the duty cycle of the first audio square wave, and being generated to have a pulse representing more than a period of time from a rising edge of the second audio square wave to a rising edge of the first audio square wave, and generate the second processed audio signal having the reference DC level when the duty cycle of the second audio square wave is less than the duty cycle of the first audio square wave; and
first and second output stages coupled to the logic block and configured to generate first and second audio output signals respectively based upon the first and second processed audio signals.

2. The electronic device of claim 1, wherein the logic block generates the first processed audio signal as having a pulse representing twice a period of time from the rising edge of the first audio square wave to the rising edge of the second audio square wave; and wherein the logic block generates the second processed audio signal as having a pulse representing twice a period of time from the rising edge of the second audio square wave to the rising edge of the first audio square wave.

3. The electronic device of claim 1, wherein the first output stage comprises:
a first amplifier configured to receive the first processed audio signal and to generate a first amplified audio signal,
a first PMOS transistor having a source coupled to a supply voltage, a drain, and a gate to receive the first amplified audio signal, and
a first NMOS transistor having a source coupled to ground, a drain coupled to the drain of the first PMOS transistor, and a gate to receive the first amplified audio signal,
wherein the first PMOS transistor and first NMOS transistor cooperate to generate the first audio output signal;
and wherein the second output stage comprises:
a second amplifier configured to receive the second processed audio signal and to generate a second amplified audio signal,
a second PMOS transistor having a source coupled to a supply voltage, a drain, and a gate to receive the second amplified audio signal, and
a second NMOS transistor having a source coupled to ground, a drain coupled to the drain of the second PMOS transistor, and a gate to receive the second amplified audio signal,
wherein the second PMOS transistor and second NMOS transistor cooperate to generate the second audio output signal.

4. The electronic device of claim 3, further comprising a load coupled to receive the first and second audio output signals.

5. The electronic device of claim 1, wherein the second analog audio input signal is an inverse of the first analog audio input signal; and wherein the first and second analog audio input signals are differential signals.

6. A class D amplifier, comprising:
a signal processing block configured to:
generate a first processed signal representing a difference between a first differential signal and a second differential signal when a duty cycle of the first differential signal is greater than a duty cycle of the second differential signal, and being generated to have a pulse representing more than a period of time from a rising edge of the first differential signal to a rising edge of the second differential signal,
generate the first processed signal representing a reference DC level when the duty cycle of the first differential signal is less than the duty cycle of the second differential signal,
generate a second processed signal representing a difference between the second differential signal and the first differential signal when the duty cycle of the second differential signal is greater than the duty cycle of the first differential signal, and being generated to have a pulse representing more than a period of time from a rising edge of the second differential signal to a rising edge of the first differential signal, and
generate the second processed signal representing the reference DC level, when the duty cycle of the second differential signal is less than the duty cycle of the first differential signal.

7. The class D amplifier of claim 6, further comprising first and second output stages coupled to the signal processing block and configured to generate first and second output signals respectively based upon the first and second processed signals.

8. The class D amplifier of claim 6, wherein the signal processing block comprises:
first and second inverters to configured receive the first and second differential signals and to output inverted versions of the first and second differential signals;
a first AND gate configured to generate the first processed signal as having a first logic level based upon the first differential signal and the inverted version of the second differential signal having the first logic level; and
a second AND gate configured to generate the second processed signal as having a first logic level based upon the second differential signal and the inverted version of the first differential signal having the first logic level.

9. The class D amplifier of claim 6, wherein the second differential signal is a complement of the first differential signal.

10. The class D amplifier of claim 6, wherein the signal processing block generates the first processed signal as having a pulse representing twice a period of time from the rising edge of the first differential signal to the rising edge of the second differential signal; and wherein the signal processing block generates the second processed audio signal as having a pulse representing twice a period of time from the rising edge of the second differential signal to the rising edge of the first differential signal.

11. A method of amplifying an analog audio signal, comprising:
receiving a first analog signal, the first analog signal being the analog signal;
receiving a second analog signal, the second analog signal being a complement of the analog signal;
converting the first and second analog input signals into first and second square waves;
generating a first processed signal representing a difference between the first square wave and the second square wave when a duty cycle of the first square wave is greater than a duty cycle of the second square wave, and being generated to have a pulse representing more than a period of time from a rising edge of the first square wave to a rising edge of the second square wave;
generating the first processed signal as a reference DC level, when the duty cycle of the first square wave is less than the duty cycle of the second square wave;
generating a second processed signal representing a difference between the second square wave and the first square wave when the duty cycle of the second square wave is greater than the duty cycle of the first square wave, and being generated to have a pulse representing more than a period of time from a rising edge of the second square wave to a rising edge of the first square wave;

generating the second processed signal as the reference DC level, when the duty cycle of the second square wave is less than the duty cycle of the first square wave; and generating first and second output signals respectively based upon the first and second processed signals, using respective first and second output stages.

12. The method of claim 11, wherein the first analog input signal is converted into the first square wave by comparing the first analog input signal to a triangle wave;

and wherein the second analog input signal is converted into a second square wave by comparing the second analog input signal to a triangle wave.

13. The method of claim 11, wherein the first processed signal is generated to have a pulse representing twice a period of time from the rising edge of the first square wave to the rising edge of the second square wave; and wherein the second processed signal is generated to have a pulse representing twice a period of time from the rising edge of the second square wave to the rising edge of the first square wave.

14. The method of claim 11, wherein the second analog input signal is a complement of the first analog input signal.

15. An electronic device, comprising:
first and second comparators configured to respectively convert first and second analog audio input signals into first and second audio square waves;
a logic block coupled to receive the first and second audio square waves from the first and second comparators and configured to:
generate a first processed audio signal having a pulse representing twice a period of time from a rising edge of the first audio square wave to a rising edge of the second audio square wave when a duty cycle of the first audio square wave is greater than a duty cycle of the second audio square wave,
generate the first processed audio signal having a reference DC level when the duty cycle of the first audio square wave is less than the duty cycle of the second audio square wave,
generate a second processed audio signal having a pulse representing twice a period of time from a rising edge of the second audio square wave to a rising edge of the first audio square wave when the duty cycle of the second audio square wave is greater than the duty cycle of the first audio square wave, and
generate the second processed audio signal having the reference DC level when the duty cycle of the second audio square wave is less than the duty cycle of the first audio square wave; and
first and second output stages coupled to the logic block and configured to generate first and second audio output signals respectively based upon the first and second processed audio signals.

16. The electronic device of claim 15, wherein the first comparator is configured to convert the first analog audio input signal into a first audio square wave by comparing the first analog audio input signal to a triangle wave; and wherein the second comparator is configured to convert the second analog audio input signal into a second audio square wave by comparing the second analog audio input signal to a triangle wave.

17. The electronic device of claim 15,
wherein the first output stage comprises:
a first amplifier configured to receive the first processed audio signal and to generate a first amplified audio signal,
a first PMOS transistor having a source coupled to a supply voltage, a drain, and a gate to receive the first amplified audio signal, and
a first NMOS transistor having a source coupled to ground, a drain coupled to the drain of the first PMOS transistor, and a gate to receive the first amplified audio signal,
wherein the first PMOS transistor and first NMOS transistor cooperate to generate the first audio output signal;
and wherein the second output stage comprises:
a second amplifier configured to receive the second processed audio signal and to generate a second amplified audio signal,
a second PMOS transistor having a source coupled to a supply voltage, a drain, and a gate to receive the second amplified audio signal, and
a second NMOS transistor having a source coupled to ground, a drain coupled to the drain of the second PMOS transistor, and a gate to receive the second amplified audio signal,
wherein the second PMOS transistor and second NMOS transistor cooperate to generate the second audio output signal.

18. An electronic device, comprising:
first and second comparators configured to respectively convert first and second analog audio input signals into first and second audio square waves by comparing the first and second analog audio input signals to first and second waves having a reference period such that the first and second analog audio input signals each transition twice during the reference period;
a logic block coupled to receive the first and second audio square waves from the first and second comparators and configured to generate first and second processed audio signals based upon the first and second audio square waves, only one of the first and second processed audio signals transitioning exactly twice during the reference period;
first and second output stages coupled to the logic block and configured to generate first and second audio output signals respectively based upon the first and second processed audio signals.

19. An electronic device, comprising:
first and second comparators configured to respectively convert first and second analog audio input signals into first and second audio square waves by comparing the first and second analog audio input signals to a sawtooth wave;
a logic block coupled to receive the first and second audio square waves from the first and second comparators and configured to:
generate a first processed audio signal representing a difference between the first audio square wave and the second audio square wave when a duty cycle of the first audio square wave is greater than a duty cycle of the second audio square wave, and being generated to have a pulse representing a period of time from a rising edge of the first audio square wave to a rising edge of the second audio square wave,
generate the first processed audio signal having a reference DC level when the duty cycle of the first audio square wave is less than the duty cycle of the second audio square wave, generate a second processed audio signal representing a difference between the second audio square wave and the first audio square wave when the duty cycle of the second audio square wave is greater than the duty cycle of the first audio square wave, and being generated to have a pulse representing a period of time from a rising edge of the second audio square wave to a rising edge of the first audio square wave, and generate the second processed audio signal having the reference DC level when the duty cycle of the second audio square wave is less than the duty cycle of the first audio square wave; and first and second output stages coupled to the logic block and configured to generate first and second audio output signals respectively based upon the first and second processed audio signals.

20. The electronic device of claim 19, wherein the logic block comprises:

first and second inverters to configured receive the first and second audio square waves and to output inverted versions of the first and second audio square waves;

a first AND gate configured to generate the first processed audio signal as having a first logic level based upon the first audio square wave and the inverted version of the second audio square wave having the first logic level; and a second AND gate configured to generate the second processed audio signal as having a first logic level based upon the second audio square wave and the inverted version of the first audio square wave having the first logic level.

21. The electronic device of claim 19, wherein the first output stage comprises:

a first amplifier configured to receive the first processed audio signal and to generate a first amplified audio signal, a first PMOS transistor having a source coupled to a supply voltage, a drain, and a gate to receive the first amplified audio signal, and a first NMOS transistor having a source coupled to ground, a drain coupled to the drain of the first PMOS transistor, and a gate to receive the first amplified audio signal, wherein the first PMOS transistor and first NMOS transistor cooperate to generate the first audio output signal;

and wherein the second output stage comprises:

a second amplifier configured to receive the second processed audio signal and to generate a second amplified audio signal, a second PMOS transistor having a source coupled to a supply voltage, a drain, and a gate to receive the second amplified audio signal, and a second NMOS transistor having a source coupled to ground, a drain coupled to the drain of the second PMOS transistor, and a gate to receive the second amplified audio signal, wherein the second PMOS transistor and second NMOS transistor cooperate to generate the second audio output signal.

* * * * *